(12) United States Patent
Takahashi et al.

(10) Patent No.: US 12,520,661 B2
(45) Date of Patent: Jan. 6, 2026

(54) ORGANIC LIGHT-EMITTING ELEMENT, AND DISPLAY APPARATUS, IMAGING APPARATUS, LIGHTING APPARATUS, ELECTRONIC EQUIPMENT, AND IMAGE-FORMING APPARATUS INCLUDING THE SAME

(71) Applicant: CANON KABUSHIKI KAISHA, Tokyo (JP)

(72) Inventors: Tetsuo Takahashi, Kanagawa (JP); Takayuki Ito, Kanagawa (JP); Yojiro Matsuda, Kanagawa (JP); Yoshihisa Kawamura, Kanagawa (JP); Yuto Nozaki, Kanagawa (JP); Satoshi Yokoyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 397 days.

(21) Appl. No.: 18/178,060

(22) Filed: Mar. 3, 2023

(65) Prior Publication Data
US 2023/0292546 A1     Sep. 14, 2023

(30) Foreign Application Priority Data

Mar. 7, 2022   (JP) .................. 2022-034573

(51) Int. Cl.
*H10K 50/858*     (2023.01)
*H10K 50/856*     (2023.01)

(52) U.S. Cl.
CPC ......... *H10K 50/858* (2023.02); *H10K 50/856* (2023.02)

(58) Field of Classification Search
CPC .............. H10K 50/858; H10K 50/856; H10K 59/1201; H10K 59/879; H10K 59/38; H10K 59/878
See application file for complete search history.

(56) References Cited

U.S. PATENT DOCUMENTS

| | | | |
|---|---|---|---|
| 10,078,243 B2* | 9/2018 | Kubota | G02F 1/133305 |
| 11,778,858 B1* | 10/2023 | Chen | H10K 59/38 |
| | | | 257/40 |
| 2013/0249383 A1* | 9/2013 | Yoo | H10K 59/8791 |
| | | | 445/24 |
| 2017/0125489 A1* | 5/2017 | Jang | H10K 59/351 |
| 2019/0181384 A1* | 6/2019 | Forrest | G02B 3/0056 |
| 2019/0393447 A1* | 12/2019 | Yun | H10K 50/865 |
| 2021/0206142 A1* | 7/2021 | Gu | G02B 1/115 |
| 2021/0391513 A1* | 12/2021 | Choi | G02B 3/0062 |
| 2023/0131918 A1* | 4/2023 | Tonkikh | H10H 20/815 |
| | | | 257/13 |

(Continued)

FOREIGN PATENT DOCUMENTS

| | | |
|---|---|---|
| JP | 2012156095 A | 8/2012 |
| JP | 2013545249 A | 12/2013 |

(Continued)

*Primary Examiner* — Ibrahim A Khan
(74) *Attorney, Agent, or Firm* — Canon U.S.A., Inc. IP Division

(57) ABSTRACT

A light-emitting element includes a first electrode, a second electrode, and a light-emitting layer between the first electrode and the second electrode. The light-emitting element includes a transmittance-increasing layer with increasing transmittance in an optical path of light emitted from the light-emitting layer.

21 Claims, 10 Drawing Sheets

(56) References Cited

U.S. PATENT DOCUMENTS

| | | | | |
|---|---|---|---|---|
| 2023/0165094 A1* | 5/2023 | Yan | ............. | H10K 59/32 |
| | | | | 257/89 |
| 2023/0273358 A1* | 8/2023 | You | ............. | G02B 5/30 |
| | | | | 349/96 |
| 2024/0096127 A1* | 3/2024 | Sharma | ............. | G02B 5/003 |

FOREIGN PATENT DOCUMENTS

| JP | 2014002880 A | 1/2014 |
|---|---|---|
| JP | 2021182459 A | 11/2021 |
| JP | 2021197550 A | 12/2021 |

\* cited by examiner

FIG. 5A
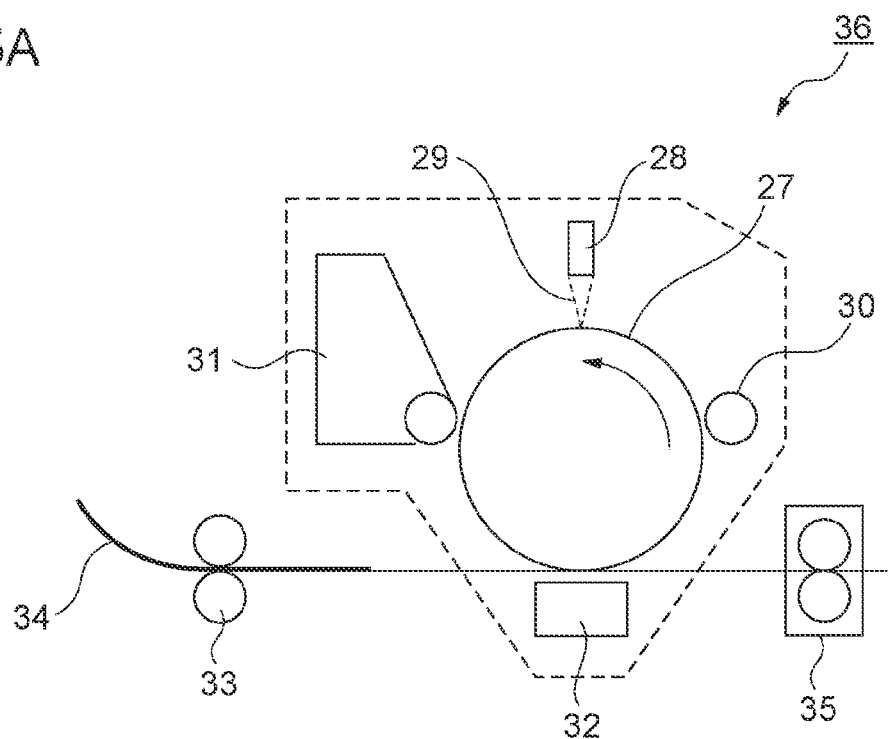
FIG. 5B
FIG. 5C
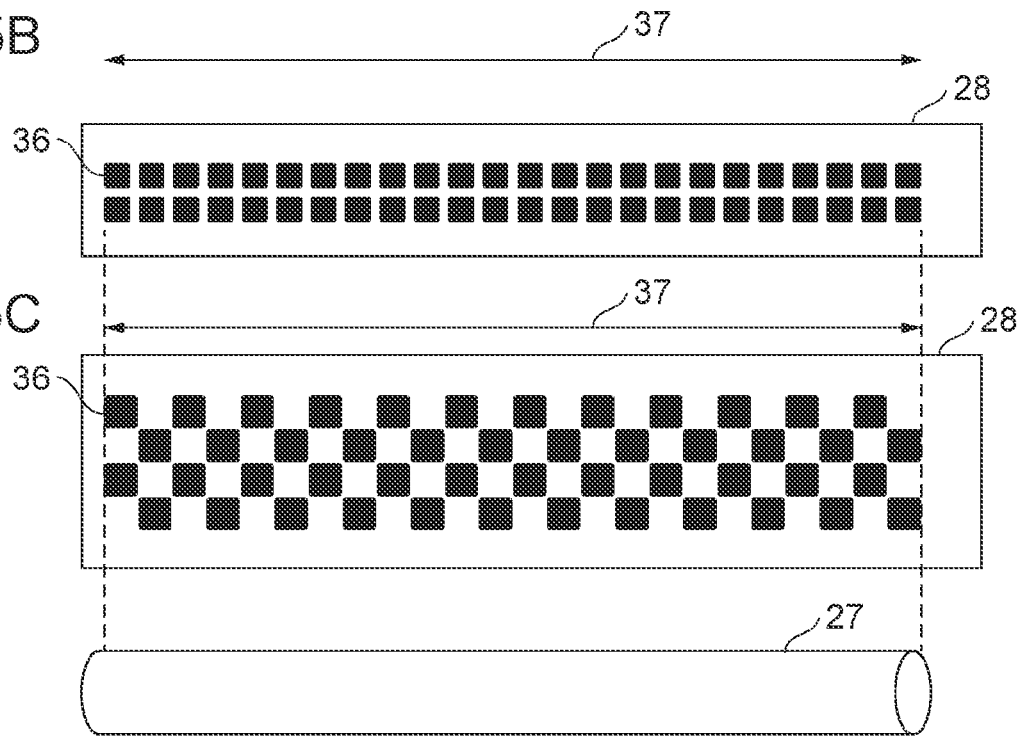

ORGANIC LIGHT-EMITTING ELEMENT, AND DISPLAY APPARATUS, IMAGING APPARATUS, LIGHTING APPARATUS, ELECTRONIC EQUIPMENT, AND IMAGE-FORMING APPARATUS INCLUDING THE SAME

BACKGROUND OF THE INVENTION

Field of the Invention

The present disclosure relates to an organic light-emitting element, and a display apparatus, an imaging apparatus, a lighting apparatus, electronic equipment, and an image-forming apparatus including the organic light-emitting element.

Description of the Related Art

An organic light-emitting element (also referred to as an organic EL element or OLED) is an electronic element that includes a pair of electrodes and an organic compound layer between these electrodes. Electrons and holes are injected from the pair of electrodes into the organic compound layer to generate an exciton of a light-emitting organic compound in the organic compound layer. When the exciton returns to its ground state, the organic light-emitting element emits light. With recent significant advances in organic light-emitting elements, low drive voltage, various emission wavelengths, high-speed responsivity, and thin and light light-emitting devices have been promoted.

Thus, organic light-emitting elements have various applications due to their usefulness and are used in exposure light sources of display apparatuses, lighting apparatuses, and image-forming apparatuses, and the like. In these applications, the duration of light emission of an organic light-emitting element serving as a main component is an important indicator. Drive life estimated from the amount of decrease in light emission from the initial luminance is known as a measure of the duration of light emission. The drive life is a half-life from the initial luminance to a half of the initial luminance or a life from the initial luminance to a 5% decrease in luminance.

Japanese Patent Laid-Open No. 2021-197550 discloses that a novel material for an organic light-emitting element is developed to increase the half-life and improve the characteristics of the organic light-emitting element. Japanese Patent Laid-Open No. 2021-182459 discloses that a novel material for an organic light-emitting element is developed to increase the life to the 5% decrease in luminance and improve the characteristics of the organic light-emitting element.

Japanese Patent Laid-Open No. 2021-197550 or Japanese Patent Laid-Open No. 2021-182459 discloses that a component of a light-emitting element is changed to increase the life of the light-emitting element and improve the characteristics of the light-emitting element. However, these techniques are intended to improve the durability of the light-emitting elements and not to reduce a decrease in the luminous brightness of the light-emitting elements and a decrease in luminance from the light-emitting elements.

SUMMARY OF THE INVENTION

In view of such disadvantages, the present disclosure provides a light-emitting element with a smaller decrease in the luminance of extracted light.

A light-emitting element according to the present disclosure includes a first electrode, a second electrode, and a light-emitting layer between the first electrode and the second electrode, wherein the light-emitting element includes a transmittance-increasing layer with increasing transmittance in an optical path of light emitted from the light-emitting layer.

Further features of the present disclosure will become apparent from the following description of exemplary embodiments with reference to the attached drawings.

BRIEF DESCRIPTION OF THE DRAWINGS

FIG. 5A is a schematic view of an image-forming apparatus according to an embodiment of the present disclosure.

FIG. 5B is a schematic view of a plurality of light-emitting portions of an exposure light source arranged on a long substrate.

FIG. 5C is a schematic view of a plurality of light-emitting portions of an exposure light source arranged on a long substrate.

DESCRIPTION OF THE EMBODIMENTS

Figure 1:
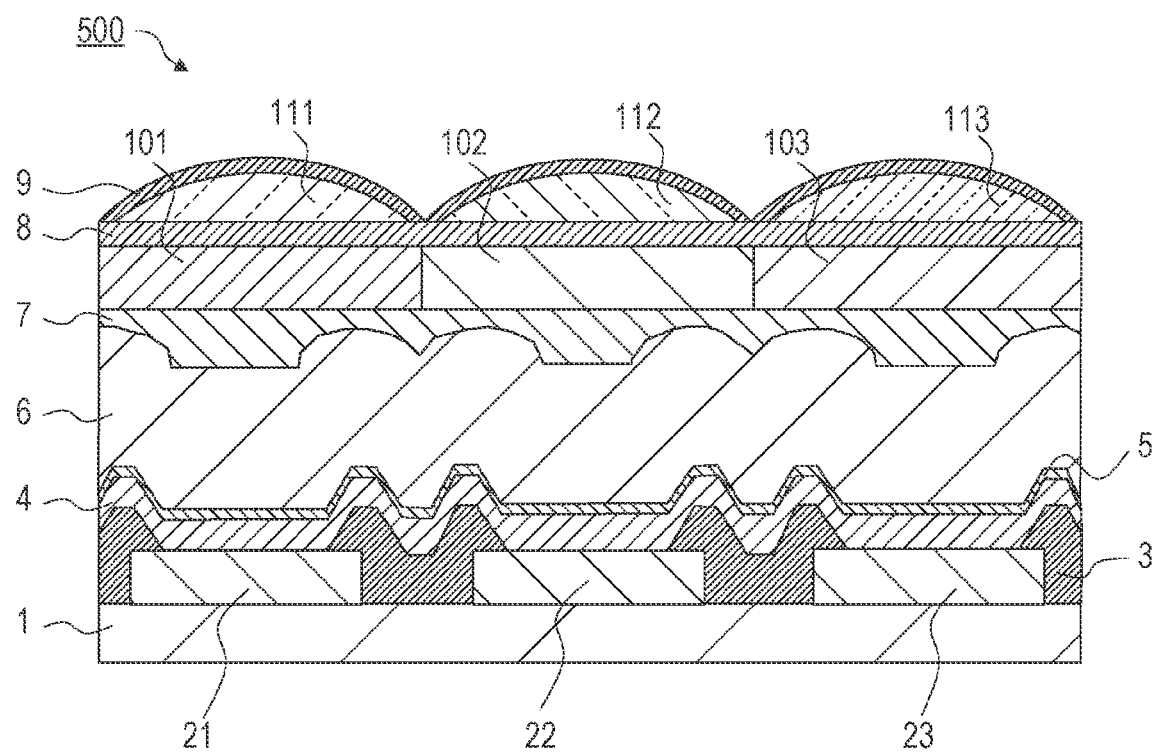
FIG. 1 is a schematic cross-sectional view of a light-emitting apparatus including a light-emitting element according to an embodiment of the present disclosure.

A light-emitting element according to the present disclosure includes a first electrode, a second electrode, and a light-emitting layer between the first electrode and the second electrode, wherein the light-emitting element includes a layer with increasing transmittance in an optical path of light emitted from the light-emitting layer.

The transmittance-increasing layer is, for example, a layer in which exposure to light changes a constituent of the layer and increases the light transmittance of the layer. The transmittance-increasing layer contains a substance that receives energy of light or the like and thereby changes transmittance.

The transmittance-increasing layer may be located on a light extraction side or a reflective electrode side of the light-emitting element in the optical path of light emitted from the light-emitting layer. More specifically, the transmittance-increasing layer may be located on a surface of a lens provided on the light extraction side or between the lens and a planarization layer in contact with the lens. When a protective layer, a color filter, and a hollow layer are provided between the light-emitting layer and the light extraction, the transmittance-increasing layer may be located between them. The hollow layer may be a glass seal or the outside air. The phrase "optical path", as used herein, refers to the optical path of extracted light. The optical path may not be the optical path of parallel propagating light in a light-emitting element.

The transmittance-increasing layer may be composed only of a substance with varying transmittance or contain a substance with varying transmittance and another substance. A substance with increasing transmittance is also referred to as a first material, and the other substance is also referred to as a second material. The mixing ratio of the other substance, if any, to the substance with varying transmittance is not particularly limited. The mixing ratio may be determined according to the rate of increase in the transmittance of the transmittance-increasing layer. The rate of increase may be compared between the initial state and a state where the transmittance of the transmittance-increasing layer no longer changes. The rate of increase in the transmittance of the transmittance-increasing layer may be 10% or less, 1% or more and 10 or less, or 2% or more and 5% or less.

The rate of increase in the transmittance of the transmittance-increasing layer may be determined in consideration of the rate of decrease in the luminance of the light-emitting layer. More specifically, the increase in the transmittance of the transmittance-increasing layer may be within ±2% of the decrease in the luminance of the light-emitting layer. In other words, the difference between the rate of increase in the transmittance of the transmittance-increasing layer and the rate of decrease in the luminance of the light-emitting layer is 2% or less.

Examples of the substance with increasing transmittance in the transmittance-increasing layer include compounds containing naphthoquinone diazide, onium salts, triazine derivatives, and hexamethoxymethylmelamine. The substance with increasing transmittance may be a substance whose transmittance is increased by exposure to light. The light may be light emitted from the light-emitting layer or external light. To stabilize extracted light by a decrease in light of the light-emitting layer and an increase in the transmittance of the substance, light emitted from the light-emitting layer can increase the transmittance of the substance. Thus, the substance can have an absorption peak in the wavelength region of an emission peak of light emitted from the light-emitting layer. In order for the transmittance-increasing layer to absorb light emitted from the light-emitting layer, an emission peak in the emission spectrum of the light emitted from the light-emitting layer can be close to an optical absorption peak in the optical absorption spectrum of the transmittance-increasing layer. The difference between the emission peak wavelength and the absorption peak wavelength may be 50 nm or less or 20 nm or less, or 0.25 eV or less. The emission peak and the absorption peak may be the maximum emission peak and the maximum absorption peak, respectively. These peaks may be in the visible light region, that is, in the range of 400 nm or more and 760 nm or less. The substance with increasing transmittance may be a substance whose transmittance is increased by heat energy or the like.

The other substance in the transmittance-increasing layer may be an organic compound or an inorganic compound. The organic compound may be an organic resin or a low-molecular-weight organic compound. The organic resin may be a novolac resin, an acrylic resin, an epoxy resin, a polyimide resin, a polystyrene resin, or a phenolic resin. The low-molecular-weight organic compound may be an arylamine compound, an aromatic hydrocarbon compound, or a metal complex. The transmittance-increasing layer may contain a compound that produces an acid by heat in addition to the resin material. The compound that produces an acid by heat may include a phosphate with an aliphatic or alicyclic moiety. More specifically, the compound may be $CF_3CF_2CF_2CF_2SO_3R_1$. $R_1$ denotes an aliphatic compound or an alicyclic compound.

The inorganic compound may be an oxide or a nitride. The oxide may be titanium oxide, aluminum oxide, silicon oxide, indium tin oxide, or indium zinc oxide. The nitride may be silicon nitride or gallium nitride. The inorganic compound may also be silicon oxynitride. These materials may be used in combination. In particular, a substance with high visible light transmittance can be used. The high visible light transmittance is a transmittance of 80% or more at 500 nm.

As described above, a light-emitting element with the transmittance-increasing layer can have a smaller decrease in extracted light. Thus, it is possible to reduce the decrease in luminance from the initial luminance and keep the luminance close to the initial luminance for a longer period.

First Embodiment

FIG. 1 is a schematic cross-sectional view of a light-emitting apparatus including a light-emitting element according to the present embodiment.

A light-emitting apparatus 500 includes a first electrode 2 on a substrate 1, a pixel separation layer 3 covering the end portion of the first electrode 2, a functional layer 4 in contact with the first electrode 2 at an opening of the pixel separation layer 3, a second electrode 5 on the functional layer 4, a protective layer 6 on the second electrode 5, a first planarization layer 7 on the protective layer 6, a color filter 10 on the first planarization layer 7, a second planarization layer 8 on the color filter 10, a lens 11 as an optical member on the second planarization layer 8, and a transmittance-increasing layer 9 on the lens 11. The functional layer 4 may include a light-emitting layer, and the lens 11 may be a microlens. When the functional layer is an organic layer, the light-emitting element may be an organic light-emitting element.

FIG. 1 shows a red-light-emitting element, a green-light-emitting element, and a blue-light-emitting element from the left side. A component of the red-light-emitting element may have a suffix "1". A component common to the light-emitting elements has no distinguishing suffix. More specifically, the first electrode of the red-light-emitting element is denoted by reference numeral 21. In addition to the reference numeral 2 of the first electrode, an additional reference numeral 1 of the red-light-emitting element is given. The green-light-emitting element may have a suffix "2", and the blue-light-emitting element may have a suffix "3". The first electrode is also referred to as a lower electrode. The red-light-emitting element is also referred to as a first light-emitting element, the green-light-emitting element is also referred to as a second light-emitting element, and the blue-light-emitting element is also referred to as a third light-emitting element.

In the present embodiment, the transmittance-increasing layer is located on the lens on the light extraction side. The transmittance-increasing layer on the lens can have high adhesive force. This effect is particularly high when the lens is a microlens.

The lens 11 has a first surface with a protrusion and a second surface opposite the first surface. The transmittance-increasing layer on the first surface of the lens has a larger surface area for receiving light than the transmittance-increasing layer on the second surface. Because the transmittance-increasing layer has increased transmittance by receiving light, the transmittance-increasing layer can be provided on the first surface of the lens to adjust the transmittance change.

In the present embodiment, the optical absorption in the transmittance-increasing layer may be higher in the light emitted from the third light-emitting element, that is, in the blue region than in another region in the visible light region. The higher optical absorption can reduce the decrease from the initial luminance for a longer period. Thus, the optical absorption in the blue region of a compound with increasing transmittance may be higher than the optical absorption in another region. The blue region may be 450 nm or more and 470 nm or less. A light-emitting material with a shorter wavelength tends to cause luminance degradation, and the present disclosure applied to the blue region can therefore easily have large advantages.

In the present embodiment, the optical absorption in the transmittance-increasing layer may be higher in the light emitted from the second light-emitting element, that is, in the green region than in another region in the visible light region. The higher optical absorption can reduce the decrease from the initial luminance for a longer period. Thus, the optical absorption in the green region of a compound with increasing transmittance may be higher than the optical absorption in another region. The green region may be 475 nm or more and 525 nm or less. The present disclosure applied to the green region with high visibility can easily reduce luminance degradation at the time of white output.

The transmittance-increasing layer 9 is located on the lens 11 in the present embodiment but may be located at another position. For example, the light-emitting apparatus 500 may further include a cover glass (not shown), and the cover glass may contain a substance with increasing transmittance. The cover glass may contain the substance as a layer on a surface of the glass or as particles in the glass. The transmittance-increasing layer 9 may be in contact with the first electrode 2. The functional layer 4 may be composed of a plurality of layers, and the transmittance-increasing layer 9 may be provided between the plurality of layers. The transmittance-increasing layer 9 may be provided between the second electrode 5 and the protective layer 6. The first planarization layer 7 may contain a substance with increasing transmittance. The transmittance-increasing layer 9 may be provided between the first planarization layer 7 and the color filter 10. The color filter 10 may contain a substance with increasing transmittance and may serve as the transmittance-increasing layer 9. In such a case, the color filter 10 serves both as a filter that preferentially transmits a specific wavelength and as the transmittance-increasing layer 9. The transmittance-increasing layer 9 may be provided between the second planarization layer 8 and the color filter 10. The second planarization layer 8 may contain a substance with increasing transmittance and may serve as the transmittance-increasing layer 9. The transmittance-increasing layer 9 may be provided between the second planarization layer 8 and the lens 11. The lens 11 may be composed of an organic resin, which contains a substance with increasing transmittance, and may serve as the transmittance-increasing layer 9.

The light-emitting layer of the functional layer 4 may have a different structure in the first to third light-emitting elements. In other words, the light-emitting layer may be of a separation mode or a side-by-side mode. In the separation mode, the blue-light-emitting material may be a fluorescent material, and the green-light-emitting material and the red-light-emitting material may be a phosphorescent material. The separation mode may include no color filter.

In the present embodiment, the luminance of the light-emitting element gradually decreases as the light-emitting element continuously emits light. In contrast, the transmittance of the transmittance-increasing layer increases gradually. Light emitted from the light-emitting layer is extracted from the light-emitting element through the transmittance-increasing layer in the optical path. The transmittance of the transmittance-increasing layer can be increased with decreasing luminance of the light-emitting layer to reduce the decrease in the luminance of extracted light from the initial luminance. This can stabilize apparent luminance and stabilize the display quality and luminance for extended periods.

Figure 2:
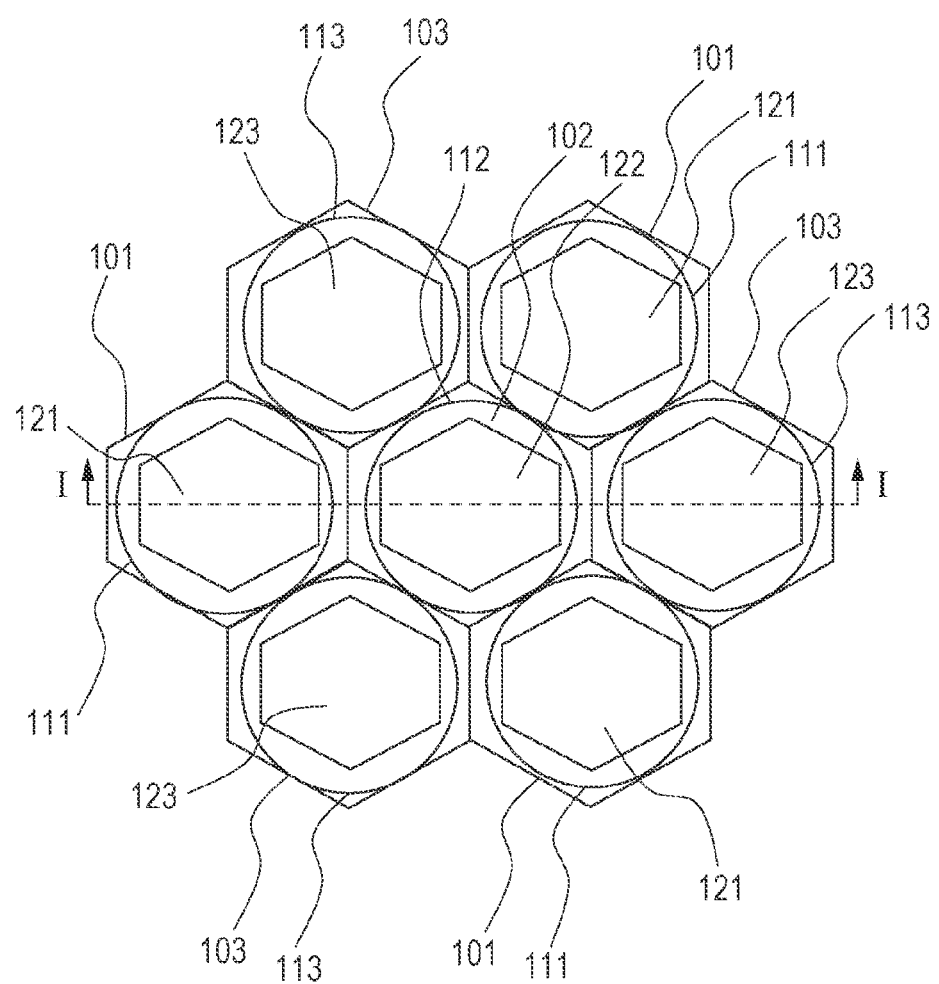
FIG. 2 is a plan view of a light-emitting apparatus including a light-emitting element according to an embodiment of the present disclosure.

FIG. 2 is a plan view of a light-emitting apparatus including a light-emitting element according to the present embodiment.

In addition to the components of FIG. 1, a light-emitting region 12 is illustrated. The light-emitting region 12 is a region of the first electrode 2 not covered with the pixel separation layer 3. The light-emitting region 12 may also be an opening of the pixel separation layer 3. Because the first electrode 2 is in contact with the functional layer 4 in the light-emitting region 12, a carrier can be injected into the functional layer 4 to emit light.

In the present embodiment, the light-emitting element is composed of RGB elements, and the plan view thereof has a delta arrangement with a honeycomb structure.

The light-emitting element is not limited thereto and may have a stripe arrangement, a Bayer arrangement, a PenTile arrangement, or a diamond PenTile arrangement. Furthermore, the light-emitting element is not limited to the RGB elements and may be composed of RGBW elements.

FIG. 1 is a cross section taken along the line I-I of FIG. 2.

The term "PenTile arrangement", as used herein, refers to an arrangement with a first column including a plurality of first light-emitting regions, a second column including a plurality of second light-emitting regions and a plurality of third light-emitting regions alternately arranged, and a third column including a plurality of second light-emitting regions and a plurality of third light-emitting regions alternately arranged in an arrangement sequence different from the second column. Thus, the second light-emitting regions in the second column are adjacent to the third light-emitting regions in the third column. Depending on the size of the light-emitting regions, the first light-emitting regions, the second light-emitting regions, and the third light-emitting regions may be in contact with each other. The second light-emitting regions may be second light-emitting elements, and the first light-emitting regions and the third light-emitting regions may be first light-emitting elements and third light-emitting elements. In the presence of a color filter, the light-emitting regions include the color filter in a plan view. Without a color filter, the light-emitting regions are light-emitting regions in a plan view.

The size of the light-emitting region may be larger in the third light-emitting element than in the second light-emitting element and may be larger in the first light-emitting element than in the third light-emitting element.

In a light-emitting apparatus with color filters, the color filters may be in line contact with each other. Furthermore, a black matrix may be provided between the color filters. In such a case, the color filters may be in line contact with each other via the black matrix.

Second Embodiment

Figure 3:
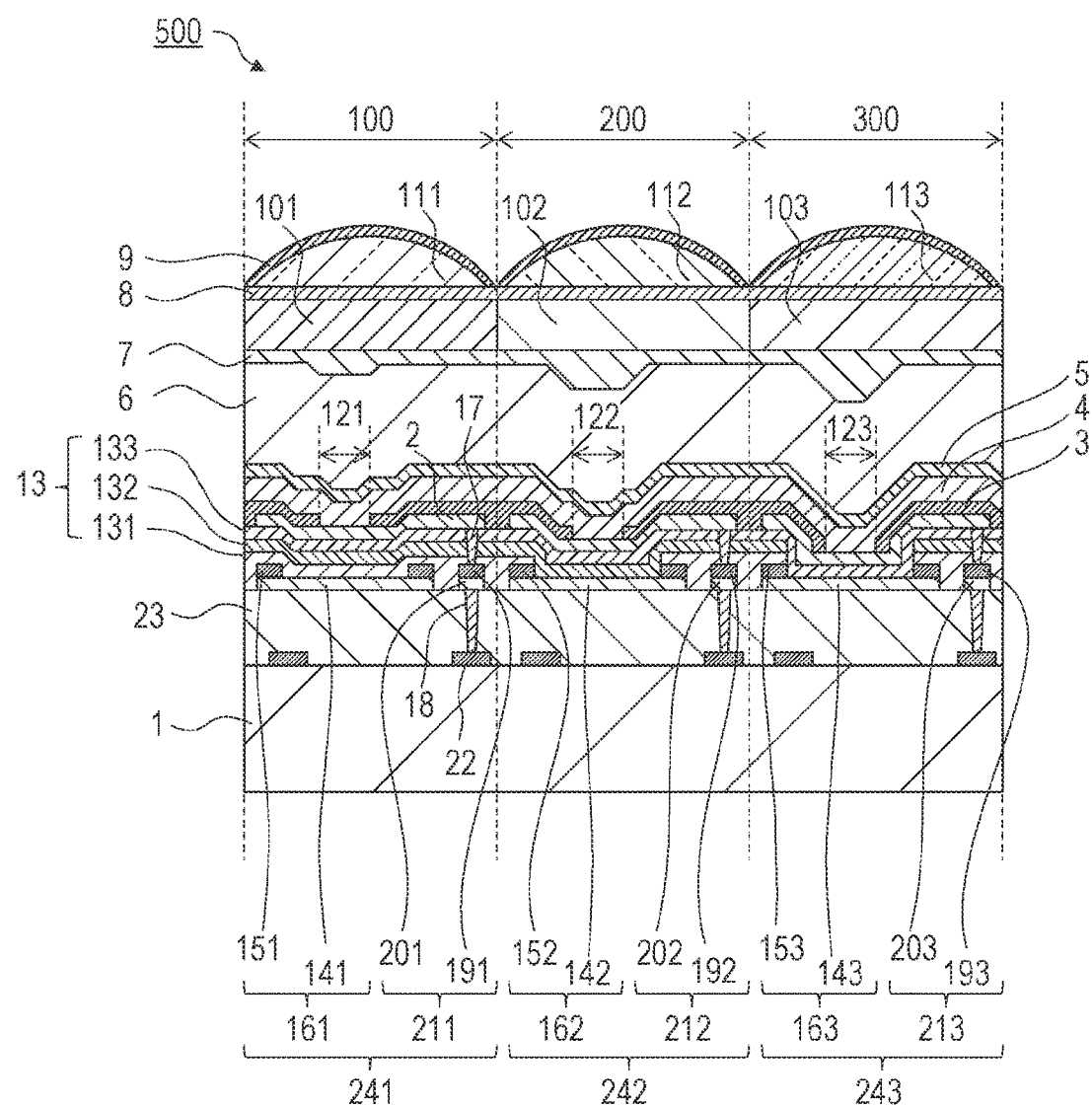
FIG. 3 is a schematic cross-sectional view of a light-emitting apparatus including a light-emitting element according to another embodiment of the present disclosure.

FIG. 3 is a schematic cross-sectional view of a light-emitting apparatus including a light-emitting element according to the present embodiment.

The present embodiment is different from the first embodiment in that the present embodiment has an interference structure including an optical interference layer between the light-emitting element and the substrate. In addition to the structure illustrated in FIG. 1, an optical interference layer 13 is provided under the first electrode 2. The optical interference layer has a different thickness in a first light-emitting element 100, a second light-emitting element 200, and a third light-emitting element 300. The first light-emitting element 100 includes a first optical interference layer 131, a second optical interference layer 132, and a third optical interference layer 133. On the other hand, the second light-emitting element 200 includes the second optical interference layer 132 and the third optical interference layer 133 and does not include the first optical interference layer. This is because the second light-emitting element 200 emits light with a shorter wavelength than the first light-emitting element 100 and therefore includes the optical interference layer with a smaller thickness than the first light-emitting element 100. Likewise, the third light-emitting element 300 includes only the third optical interference layer 133 and does not include the first optical interference layer and the second optical interference layer.

The light-emitting element according to the present embodiment includes a reflective layer 16 including a first reflective film 14 and a second reflective film 15 with lower reflectance than the first reflective film 14 under the optical interference layer. Light emitted from the light-emitting layer is reflected by the reflective layer 16, and the reflected light and extracted light cause optical interference. The extracted light may be light that is directly extracted without being reflected or light that is reflected multiple times and travels in the extraction direction.

In the light-emitting element according to the present embodiment, the first electrode is coupled to a wiring 22 via a first plug 17. The plug 17 is coupled to a second plug 18 via a galvanic corrosion inhibitor film 19 and an electrically conductive film 20 and is coupled to the wiring 22. In each element, the galvanic corrosion inhibitor film has a different suffix, such as "191" or "192". The wiring 22 is coupled to an external power supply and supplies carriers and an electric current to the light-emitting element. The plug portion 21 includes the galvanic corrosion inhibitor film 19 and the electrically conductive film 20. The plug portion 21 may overlap the protrusion of the lens 11 in a plan view. The plug portion has the suffix of the corresponding element.

Having such a stacked body 24, the light-emitting apparatus according to the present embodiment has an optical interference structure and can emit light with high luminance. Due to the high luminance and the transmittance-increasing layer, the initial luminance of extracted light is lower than the initial luminance without the transmittance-increasing layer. Consequently, the effect of reducing the decrease from the initial luminance is exhibited for a longer period, and stable light emission can be provided for a longer period.

Figure 4:
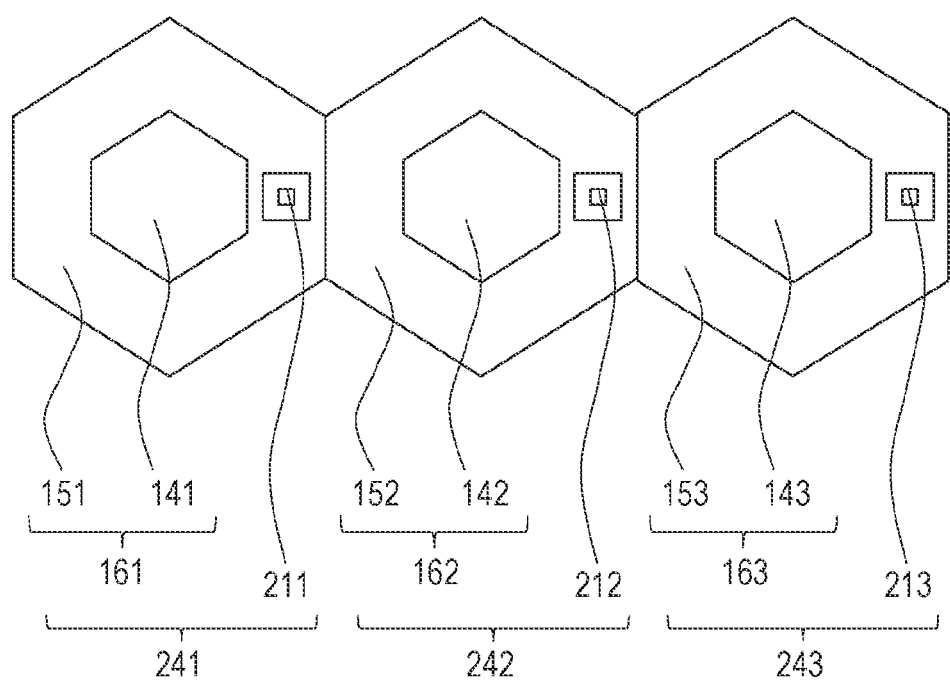
FIG. 4 is a plan view of a light-emitting apparatus including a light-emitting element according to an embodiment of the present disclosure.

FIG. 4 is a plan view of a light-emitting apparatus including a light-emitting element according to the present embodiment.

The light-emitting element according to the present embodiment is an element with a honeycomb structure. The stacked body 24 has the suffix of the corresponding element. There is a region without the galvanic corrosion inhibitor film around the plug portion 21. The region may be insulated from the surrounding second reflective film by an insulating member.

In the present embodiment, the plug portions 211, 212, and 213 are located between the first reflective films 141, 142, and 143. The plug portion 211 of the first light-emitting element may be closer to the first reflective film 141 than the first reflective film 142.

[Structure of Light-Emitting Element]

The light-emitting element includes an insulating layer, a first electrode, a functional layer, and a second electrode on a substrate. A protective layer, a color filter, a microlens, or the like may be provided on the second electrode. When a color filter is provided, a planarization layer may be provided between the color filter and a protective layer. The planarization layer may be composed of an acrylic resin or the like. The same applies to a planarization layer provided between a color filter and a microlens.

[Substrate]

The substrate may be formed of quartz, glass, a silicon wafer, resin, metal, or the like. The substrate may have a switching element, such as a transistor, and wiring, on which an insulating layer may be provided. The insulating layer may be composed of any material, provided that the insulating layer can have a contact hole for wiring between the insulating layer and the first electrode and is insulated from unconnected wires. For example, the insulating layer may be formed of a resin, such as polyimide, silicon oxide, or silicon nitride.

[Electrode]

A pair of electrodes can be used as electrodes. The pair of electrodes may be a positive electrode and a negative electrode. When an electric field is applied in a direction in which the organic light-emitting element emits light, an electrode with a high electric potential is a positive electrode, and the other electrode is a negative electrode. In other words, the electrode that supplies holes to the light-emitting layer is a positive electrode, and the electrode that supplies electrons is a negative electrode.

A constituent material of the positive electrode can have as large a work function as possible. Examples of the constituent material include metal elements, such as gold, platinum, silver, copper, nickel, palladium, cobalt, selenium, vanadium, and tungsten, mixtures thereof, alloys thereof, and metal oxides, such as tin oxide, zinc oxide, indium oxide, indium tin oxide (ITO), and indium zinc oxide. Electrically conductive polymers, such as polyaniline, polypyrrole, and polythiophene, may also be used.

These electrode materials may be used alone or in combination. The positive electrode may be composed of a single layer or a plurality of layers.

When used as a reflective electrode, for example, chromium, aluminum, silver, titanium, tungsten, molybdenum, an alloy thereof, or a laminate thereof can be used. These materials can also function as a reflective film that does not have a role as an electrode. When used as a transparent electrode, an oxide transparent conductive layer, such as indium tin oxide (ITO) or indium zinc oxide, can be used. However, the present disclosure is not limited thereto. The electrodes may be formed by photolithography.

A constituent material of the negative electrode can be a material with a small work function. For example, an alkali metal, such as lithium, an alkaline-earth metal, such as calcium, a metal element, such as aluminum, titanium, manganese, silver, lead, or chromium, or a mixture thereof may be used. An alloy of these metal elements may also be used. For example, magnesium-silver, aluminum-lithium, aluminum-magnesium, silver-copper, or zinc-silver may be used. A metal oxide, such as indium tin oxide (ITO), may also be used. These electrode materials may be used alone or in combination. The negative electrode may be composed of a single layer or a plurality of layers. In particular, silver can be used, and a silver alloy can be used to reduce the aggregation of silver. As long as the aggregation of silver can be reduced, the alloy may have any ratio. For example, the ratio of silver to another metal may be 1:1, 3:1, or the like.

The negative electrode may be, but is not limited to, an oxide conductive layer, such as ITO, for a top emission element or a reflective electrode, such as aluminum (Al), for a bottom emission element. The negative electrode may be formed by any method. A direct-current or alternating-current sputtering method can achieve good film coverage and easily decrease resistance.

[Functional Layer]

The functional layer may be an organic layer. The organic layer may be formed of a single layer or a plurality of layers. Depending on their functions, the plurality of layers may be referred to as a hole-injection layer, a hole-transport layer, an electron-blocking layer, a light-emitting layer, a hole-blocking layer, an electron-transport layer, or an electron-injection layer. The organic layer is composed mainly of an organic compound and may contain an inorganic atom or an inorganic compound. For example, the organic layer may contain copper, lithium, magnesium, aluminum, iridium, platinum, molybdenum, zinc, or the like. The organic layer may be located between the first electrode and the second electrode and may be in contact with the first electrode and the second electrode.

[Protective Layer]

A protective layer may be provided on the second electrode. For example, a glass sheet with a moisture absorbent may be attached to the second electrode to decrease the amount of water or the like entering the organic layer and to reduce the occurrence of display defects. In another embodiment, a passivation film of silicon nitride or the like may be provided on the second electrode to decrease the amount of water or the like entering the organic layer. For example, after the second electrode is formed, the negative electrode is transferred to another chamber without breaking the vacuum, and a silicon nitride film with a thickness of 2 μm may be formed as a protective layer by a chemical vapor deposition (CVD) method. The protective layer may be formed by the CVD method followed by an atomic layer deposition (ALD) method. A film formed by the ALD method may be formed of any material such as silicon nitride, silicon oxide, or aluminum oxide. Silicon nitride may be further deposited by the CVD method on the film formed by the ALD method. The film formed by the ALD method may have a smaller thickness than the film formed by the CVD method. More specifically, the thickness may be 50% or less or even 10% or less.

[Color Filter]

A color filter may be provided on the protective layer. For example, a color filter that matches the size of the organic light-emitting element may be provided on another substrate and may be bonded to the substrate on which the organic light-emitting element is provided, or a color filter may be patterned on the protective layer by photolithography. The color filter may be composed of a polymer.

[Planarization Layer]

A planarization layer may be provided between the color filter and the protective layer. The planarization layer is provided to reduce the roughness of the underlayer. The planarization layer is sometimes referred to as a material resin layer with any purpose. The planarization layer may be composed of an organic compound and can be composed of a high-molecular-weight compound, though it may be composed of a low-molecular-weight compound.

The planarization layer may be provided above and below the color filter, and the constituent materials thereof may be the same or different. Specific examples include polyvinylcarbazole resins, polycarbonate resins, polyester resins, ABS resins, acrylic resins, polyimide resins, phenolic resins, epoxy resins, silicone resins, and urea resins.

[Microlens]

The light-emitting apparatus may include an optical member, such as a microlens, on the light output side. The microlens may be composed of an acrylic resin, an epoxy resin, or the like. The microlens may be used to increase the amount of light extracted from the organic light-emitting apparatus and to control the direction of the extracted light. The microlens may have a hemispherical shape. For a hemispherical microlens, the vertex of the microlens is a contact point between the hemisphere and a tangent line parallel to the insulating layer among the tangent lines in contact with the hemisphere. The vertex of the microlens in a cross-sectional view can be determined in the same manner. More specifically, the vertex of the microlens in a cross-sectional view is a contact point between the semicircle of the microlens and a tangent line parallel to the insulating layer among the tangent lines in contact with the semicircle.

The midpoint of the microlens can also be defined. In a cross section of the microlens, a midpoint of a line segment from one end point to the other end point of the arc can be referred to as a midpoint of the microlens. A cross section in which the vertex and the midpoint are determined may be perpendicular to the insulating layer.

The microlens has a first surface with a protrusion and a second surface opposite the first surface. The second surface can be closer to the functional layer than the first surface. For such a structure, it is necessary to form the microlens on the light-emitting apparatus. When the functional layer is an organic layer, a high-temperature process can be avoided in the production process. When the second surface is closer to the functional layer than the first surface, all the organic compounds constituting the organic layer preferably have a glass transition temperature of 100° C. or more, more preferably 130° C. or more.

[Opposite Substrate]

An opposite substrate may be provided on the planarization layer. The opposite substrate is so called because it faces the substrate. The opposite substrate may be composed of the same material as the substrate. When the substrate is a first substrate, the opposite substrate may be a second substrate.

[Organic Layer]

An organic compound layer (a hole-injection layer, a hole-transport layer, an electron-blocking layer, a light-emitting layer, a hole-blocking layer, an electron-transport layer, an electron-injection layer, etc.) constituting an organic light-emitting element according to an embodiment of the present disclosure is formed by the following method.

An organic compound layer constituting an organic light-emitting element according to an embodiment of the present disclosure can be formed by a dry process, such as a vacuum evaporation method, an ionized deposition method, sputtering, or plasma. Instead of the dry process, a wet process may also be employed in which a layer is formed by a known coating method (for example, spin coating, dipping, a casting method, an LB method, an ink jet method, etc.) using an appropriate solvent.

A layer formed by a vacuum evaporation method, a solution coating method, or the like undergoes little crystallization or the like and has high temporal stability. When a film is formed by a coating method, the film may also be formed in combination with an appropriate binder resin.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

These binder resins may be used alone or in combination as a homopolymer or a copolymer. If necessary, an additive agent, such as a known plasticizer, oxidation inhibitor, and/or ultraviolet absorbent, may also be used.

[Pixel Circuit]

A light-emitting apparatus may include a pixel circuit coupled to the light-emitting element. The pixel circuit may be of an active matrix type, which independently controls the light emission of a first light-emitting element and a second light-emitting element. The active-matrix circuit may be voltage programmed or current programmed. The drive circuit has a pixel circuit for each pixel. The pixel circuit may include a light-emitting element, a transistor for controlling the luminous brightness of the light-emitting element, a transistor for controlling light emission timing, a capacitor for holding the gate voltage of the transistor for controlling the luminous brightness, and a transistor for GND connection without through the light-emitting element.

A light-emitting apparatus includes a display region and a peripheral region around the display region. The display region includes the pixel circuit, and the peripheral region includes a display control circuit. The mobility of a transistor constituting the pixel circuit may be smaller than the mobility of a transistor constituting the display control circuit.

The gradient of the current-voltage characteristics of a transistor constituting the pixel circuit may be smaller than the gradient of the current-voltage characteristics of a transistor constituting the display control circuit. The gradient of the current-voltage characteristics can be determined by so-called Vg-Ig characteristics.

A transistor constituting the pixel circuit is a transistor coupled to a light-emitting element, such as a first light-emitting element.

[Pixel]

An organic light-emitting apparatus has a plurality of pixels. Each pixel has subpixels that emit light of different colors. For example, the subpixels may have RGB emission colors.

In each pixel, a region also referred to as a pixel aperture emits light. This region is the same as the first region. The pixel aperture may be 15 µm or less or 5 µm or more. More specifically, the pixel aperture may be 11 µm, 9.5 µm, 7.4 µm, or 6.4 µm.

The distance between the subpixels may be 10 µm or less, more specifically, 8 µm, 7.4 µm, or 6.4 µm.

The pixels may be arranged in a known form in a plan view. Examples include a stripe arrangement, a delta arrangement, a PenTile arrangement, and a Bayer arrangement. Each subpixel may have any known shape in a plan view. Examples include quadrangles, such as a rectangle and a rhombus, and a hexagon. As a matter of course, the rectangle also includes a figure that is not strictly rectangular but is close to rectangular. The shape of each subpixel and the pixel array can be used in combination.

[Applications of Light-Emitting Element According to Embodiment of Present Disclosure]

An organic light-emitting element according to an embodiment of the present disclosure can be used as a constituent of a display apparatus or a lighting apparatus.

Other applications include an exposure light source for an electrophotographic image-forming apparatus, a backlight for a liquid crystal display, and a light-emitting apparatus with a color filter in a white light source.

The display apparatus may be an image-information-processing apparatus that includes an image input unit for inputting image information from an area CCD, a linear CCD, a memory card, or the like, includes an information processing unit for processing the input information, and displays an input image on a display unit.

A display unit of an imaging apparatus or an ink jet printer may have a touch panel function. A driving system of the touch panel function may be, but is not limited to, an infrared radiation system, an electrostatic capacitance system, a resistive film system, or an electromagnetic induction system. The display apparatus may be used for a display unit of a multifunction printer.

Next, a display apparatus according to the present embodiment is described with reference to the accompanying drawings.

FIGS. 5A to 5C illustrate an image-forming apparatus according to an embodiment of the present disclosure. FIG. 5A is a schematic view of an image-forming apparatus 36 according to an embodiment of the present disclosure. The image-forming apparatus includes a photosensitive member, an exposure light source, a developing unit, a charging unit, a transfer unit, a conveying roller, and a fixing unit.

An exposure light source 28 emits light 29 to form an electrostatic latent image on the surface of a photosensitive member 27. The exposure light source includes an organic light-emitting element according to the present disclosure. A developing unit 31 contains toner and the like. A charging unit 30 electrifies the photosensitive member. A transfer unit 32 transfers a developed image onto a recording medium 34. A conveying unit 33 conveys the recording medium 34. The recording medium 34 is paper, for example. A fixing unit 35 fixes an image on the recording medium.

FIGS. 5B and 5C are schematic views of a plurality of light-emitting portions 36 arranged on a long substrate in the exposure light source 28. Organic light-emitting elements are arranged in a direction 37 parallel to the axis of the photosensitive member. This column direction is the same as the direction of the rotation axis of the photosensitive member 27. This direction can also be referred to as the major-axis direction of the photosensitive member.

In FIG. 5B, the light-emitting portions are arranged in the major-axis direction of the photosensitive member. In FIG. 5C, unlike FIG. 5B, the light-emitting portions are alternately arranged in the column direction in the first and second columns. The first and second columns are arranged at different positions in the row direction.

In the first column, the light-emitting portions are arranged at intervals. In the second column, the light-emitting portions are arranged at positions corresponding to the spaces between the light-emitting portions of the first column. Thus, the light-emitting portions are also arranged at intervals in the row direction.

The arrangement in FIG. 5C can also be referred to as a grid-like pattern, a staggered pattern, or a checkered pattern, for example.

Figure 6:
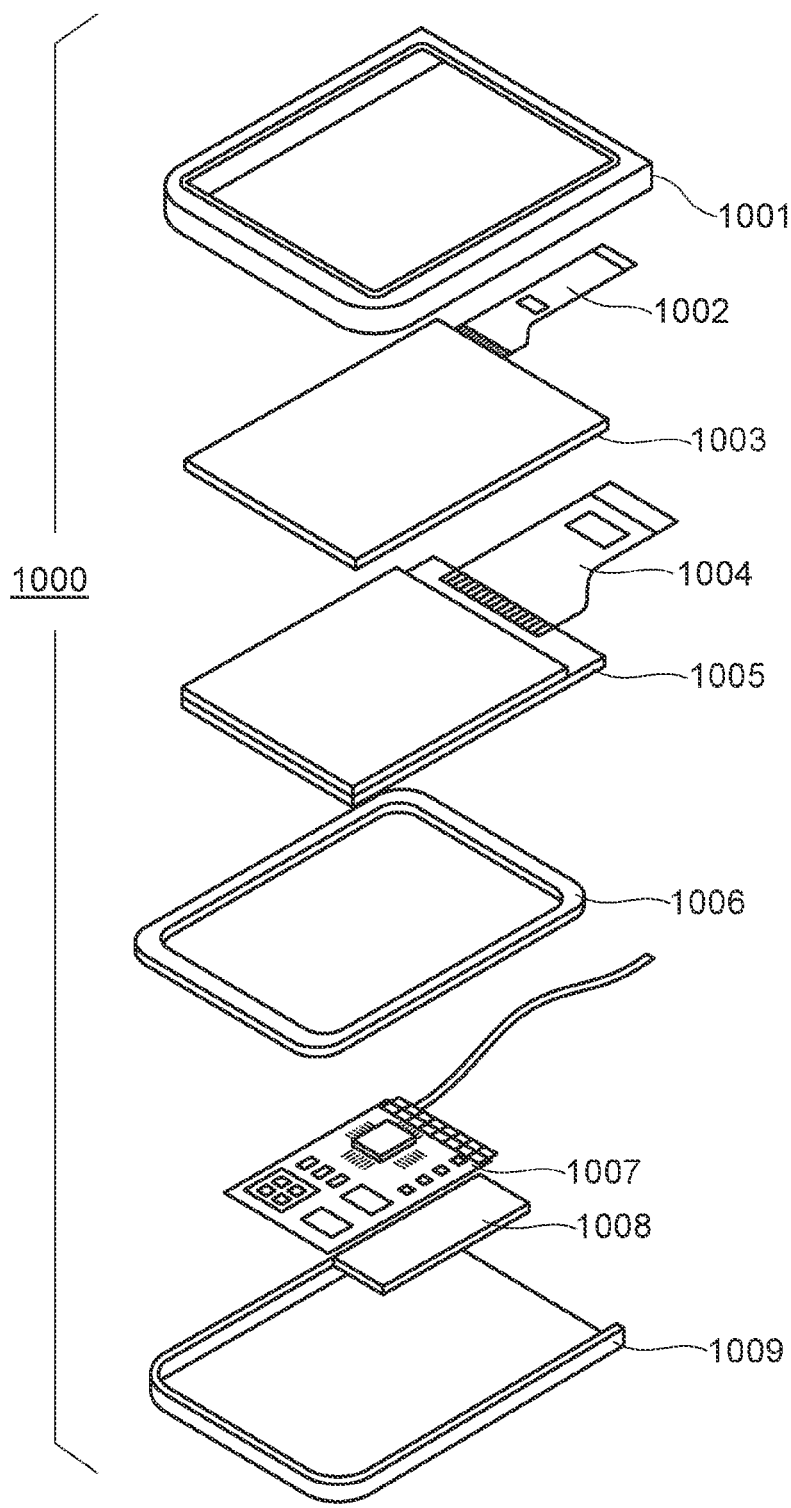
FIG. 6 is a schematic view of an example of a display apparatus according to an embodiment of the present disclosure.

FIG. 6 is a schematic view of an example of the display apparatus according to the present embodiment. A display apparatus 1000 may include a touch panel 1003, a display panel 1005, a frame 1006, a circuit substrate 1007, and a battery 1008 between an upper cover 1001 and a lower cover 1009. The touch panel 1003 and the display panel 1005 are coupled to flexible print circuits FPC 1002 and 1004, respectively. Transistors are printed on the circuit substrate 1007. The battery 1008 may not be provided when the display apparatus is not a mobile device, or may be provided at another position even when the display apparatus is a mobile device.

The display apparatus according to the present embodiment may include color filters of red, green, and blue colors. In the color filters, the red, green, and blue colors may be arranged in a delta arrangement.

The display apparatus according to the present embodiment may be used for a display unit for a mobile terminal. Such a display apparatus may have both a display function and an operation function. Examples of the mobile terminal include mobile phones, such as smartphones, tablets, and head-mounted displays.

The display apparatus according to the present embodiment may be used for a display unit of an imaging apparatus that includes an optical unit with a plurality of lenses and an imaging element for receiving light passing through the optical unit. The imaging apparatus may include a display unit for displaying information acquired by the imaging element. The display unit may be a display unit exposed outside from the imaging apparatus or a display unit located in a finder. The imaging apparatus may be a digital camera or a digital video camera.

Figure 7A:
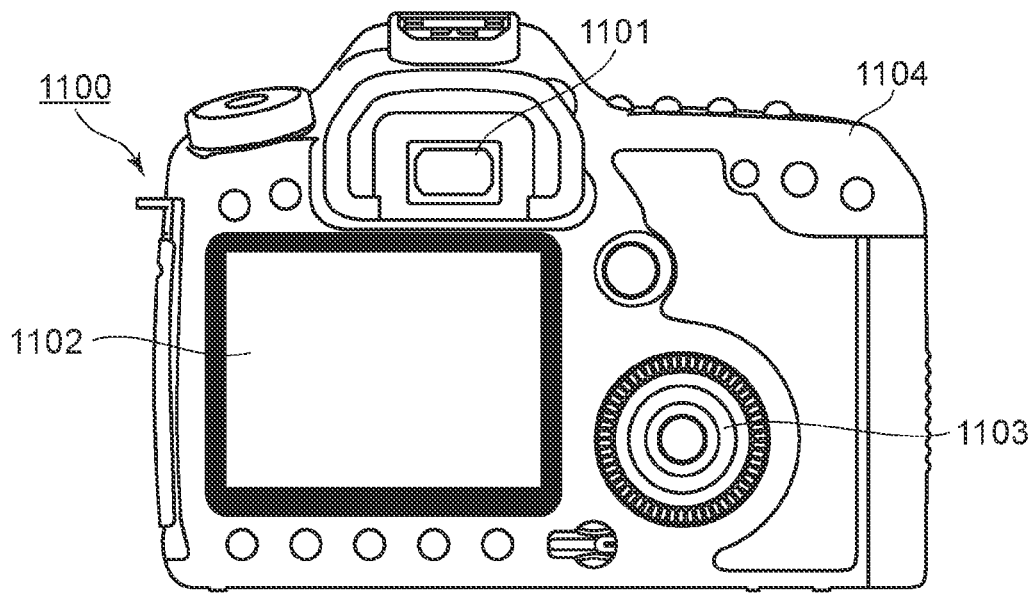
FIG. 7A is a schematic view of an example of an imaging apparatus according to an embodiment of the present disclosure.

FIG. 7A is a schematic view of an example of an imaging apparatus according to the present embodiment. An imaging apparatus 1100 may include a viewfinder 1101, a rear display 1102, an operating unit 1103, and a housing 1104. The viewfinder 1101 may include the display apparatus according to the present embodiment. In such a case, the display apparatus may display environmental information, imaging instructions, and the like as well as an image to be captured. The environmental information may include the intensity of external light, the direction of external light, the travel speed of the photographic subject, the possibility that the photographic subject is shielded by a shielding material, and the like.

Because the appropriate timing for imaging is a short time, it is better to display information as soon as possible. Thus, a display apparatus including an organic light-emitting element according to the present disclosure can be used. This is because the organic light-emitting element has a high response speed. A display apparatus including the organic light-emitting element can be more suitably used than these apparatuses and liquid crystal displays that require a high display speed.

The imaging apparatus 1100 includes an optical unit (not shown). The optical unit has a plurality of lenses and focuses an image on an imaging element in the housing 1104. The focus of the lenses can be adjusted by adjusting their relative positions. This operation can also be automatically performed. The imaging apparatus may also be referred to as a photoelectric conversion apparatus. The photoelectric conversion apparatus can have, as an imaging method, a method of detecting a difference from a previous image or a method of cutting out a permanently recorded image, instead of taking an image one after another.

Figure 7B:
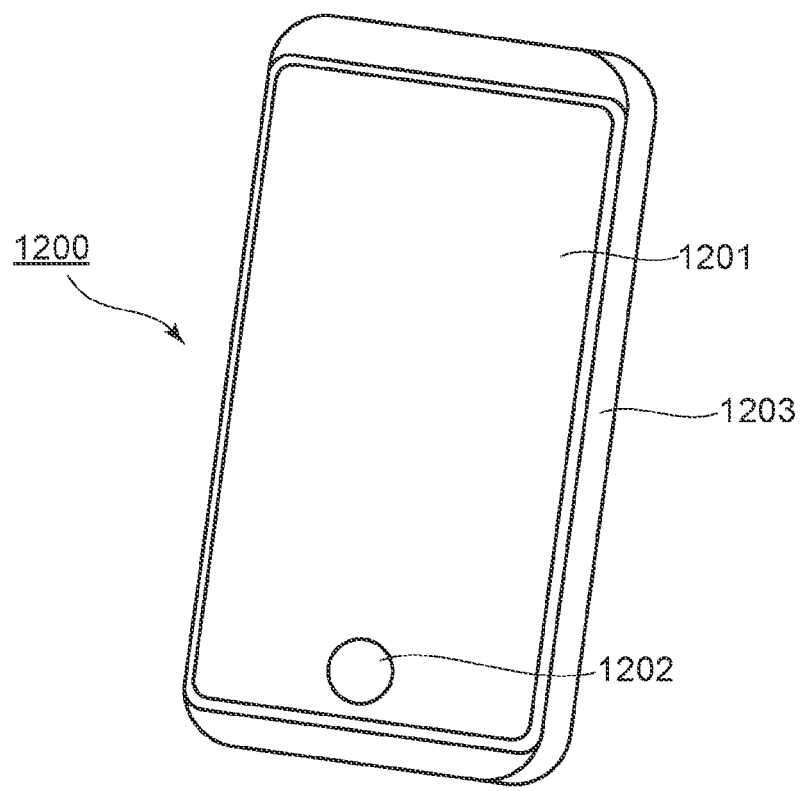
FIG. 7B is a schematic view of an example of electronic equipment according to an embodiment of the present disclosure.

FIG. 7B is a schematic view of an example of an electronic equipment according to the present embodiment. Electronic equipment 1200 includes a display unit 1201, an operating unit 1202, and a housing 1203. The housing 1203 may include a circuit, a printed circuit board including the circuit, a battery, and a communication unit. The operating unit 1202 may be a button or a touch panel response unit. The operating unit may be a biometric recognition unit that recognizes a fingerprint and releases the lock. Electronic equipment with a communication unit may also be referred to as communication equipment. The electronic equipment may have a lens and an imaging element and thereby further have a camera function. An image captured by the camera function is displayed on the display unit. The electronic equipment may be a smartphone, a notebook computer, or the like.

Figure 8A:
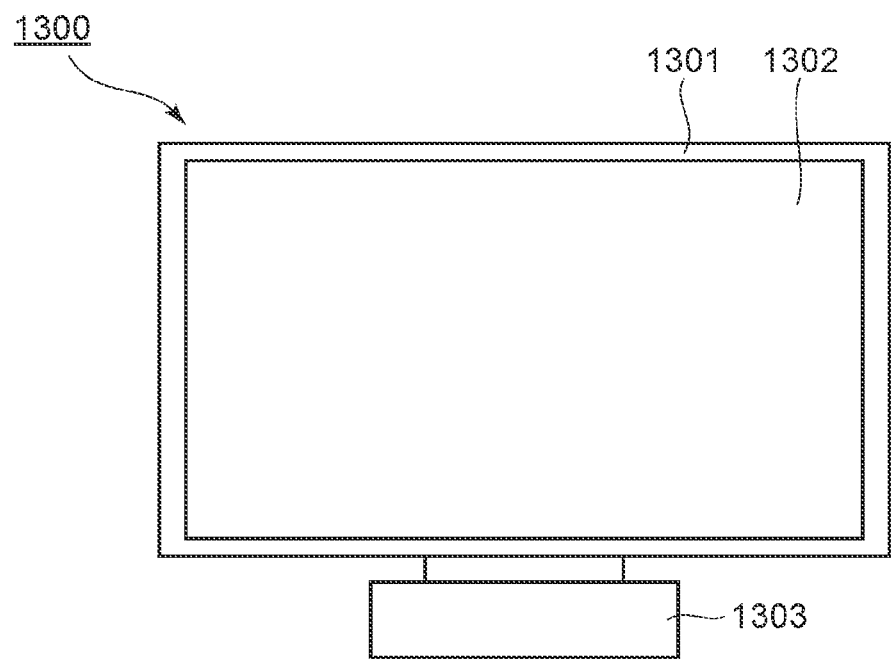
FIG. 8A is a schematic view of an example of a display apparatus according to an embodiment of the present disclosure.
Figure 8B:
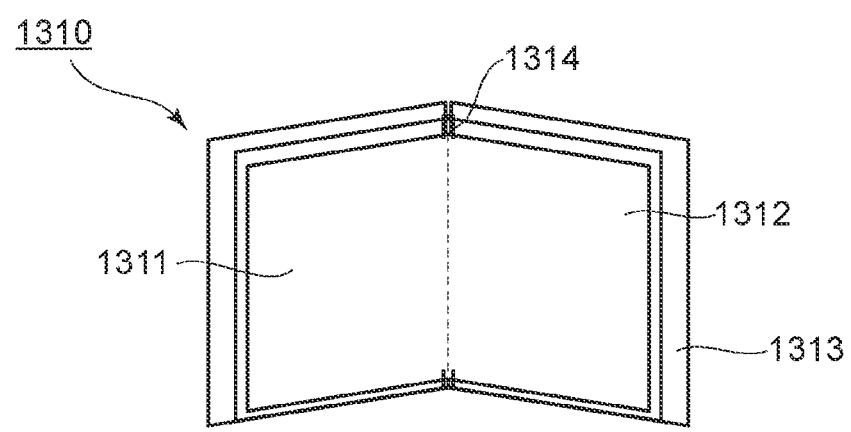
FIG. 8B is a schematic view of an example of a foldable display apparatus.

FIGS. 8A and 8B are schematic views of an example of the display apparatus according to the present embodiment. FIG. 8A illustrates a display apparatus, such as a television monitor or a PC monitor. A display apparatus 1300 includes a frame 1301 and a display unit 1302. The light-emitting apparatus according to the present embodiment may be used for the display unit 1302.

The frame 1301 and the display unit 1302 are supported by a base 1303. The base 1303 is not limited to the structure illustrated in FIG. 8A. The lower side of the frame 1301 may also serve as the base.

The frame 1301 and the display unit 1302 may be bent. The radius of curvature may be 5000 mm or more and 6000 mm or less.

FIG. 8B is a schematic view of another example of the display apparatus according to the present embodiment. A display apparatus 1310 illustrated in FIG. 8B is configured to be foldable and is a so-called foldable display apparatus. The display apparatus 1310 includes a first display unit 1311, a second display unit 1312, a housing 1313, and a folding point 1314. The first display unit 1311 and the second display unit 1312 may include the light-emitting apparatus according to the present embodiment. The first display unit 1311 and the second display unit 1312 may be a single display apparatus without a joint. The first display unit 1311 and the second display unit 1312 can be divided by the folding point. The first display unit 1311 and the second display unit 1312 may display different images or one image.

Figure 9A:
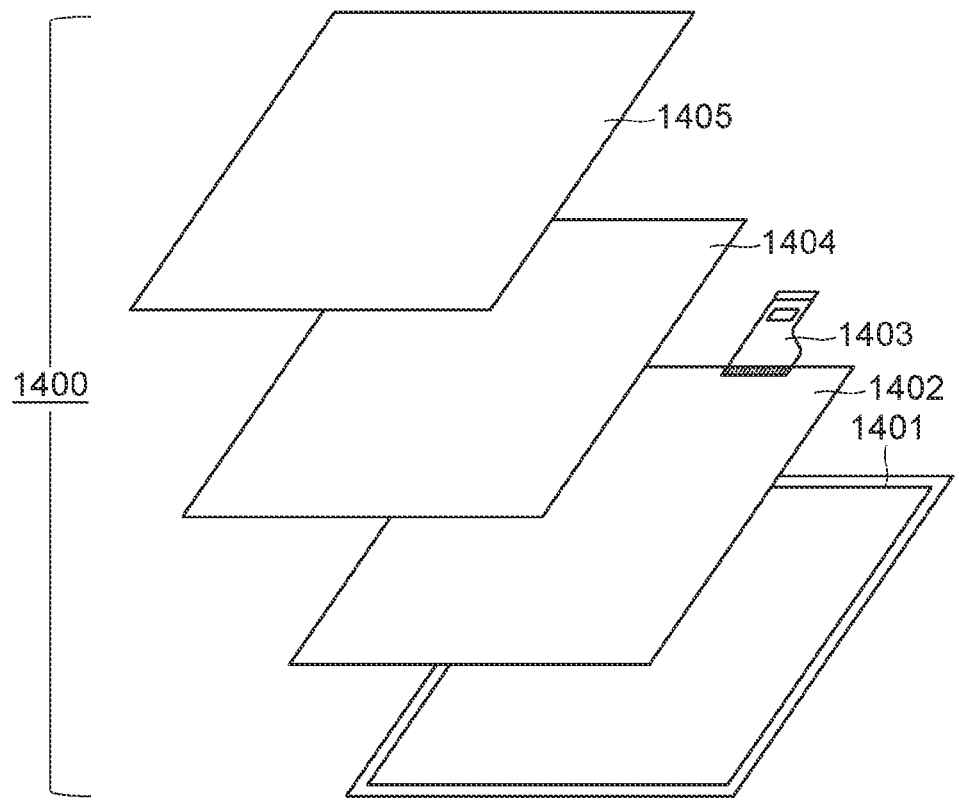
FIG. 9A is a schematic view of an example of a lighting apparatus according to an embodiment of the present disclosure.

FIG. 9A is a schematic view of an example of a lighting apparatus according to the present embodiment. A lighting apparatus 1400 may include a housing 1401, a light source 1402, a circuit substrate 1403, an optical filter 1404, and a light-diffusing unit 1405. The light source may include the organic light-emitting element according to the present embodiment. The optical filter may be a filter for improving the color rendering properties of the light source. The light-diffusing unit can effectively diffuse light from the light source and widely spread light as in illumination. The optical filter and the light-diffusing unit may be provided on the light output side of the illumination. If necessary, a cover may be provided on the outermost side.

For example, the lighting apparatus is an interior lighting apparatus. The lighting apparatus may emit white light, neutral white light, or light of any color from blue to red. The lighting apparatus may have a light control circuit for controlling such light. The lighting apparatus may include an organic light-emitting element according to the present disclosure and a power supply circuit coupled thereto. The power supply circuit is a circuit that converts an AC voltage to a DC voltage. White has a color temperature of 4200 K, and neutral white has a color temperature of 5000 K. The lighting apparatus may have a color filter.

The lighting apparatus according to the present embodiment may include a heat dissipation unit. The heat dissipation unit releases heat from the apparatus to the outside and may be a metal or liquid silicon with a high specific heat.

Figure 9B:
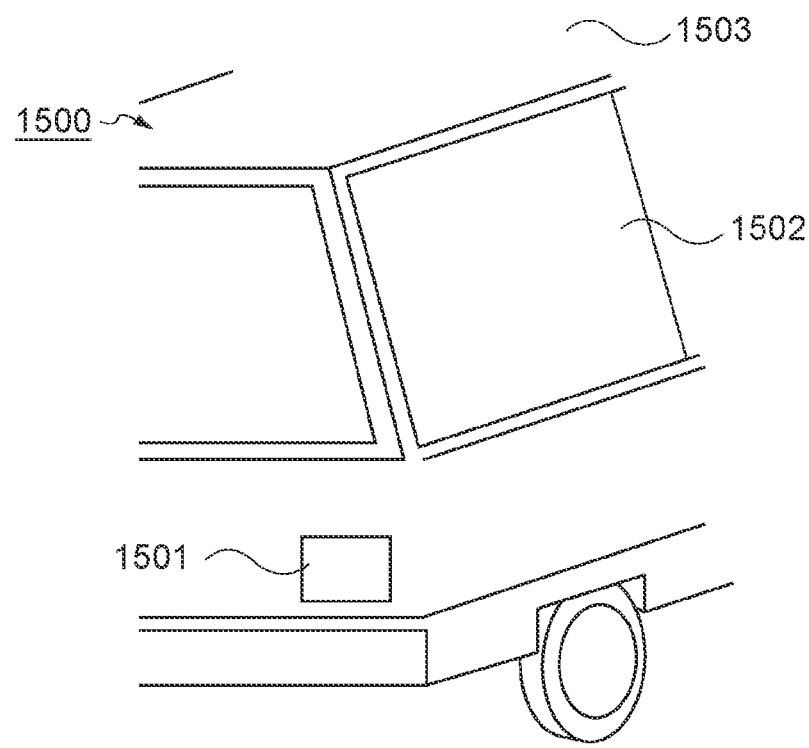
FIG. 9B is a schematic view of an example of an automobile with a vehicle lamp according to an embodiment of the present disclosure.

FIG. 9B is a schematic view of an automobile as an example of a moving body according to the present embodiment. The automobile has a taillight as an example of a lamp. An automobile 1500 may have a taillight 1501, which comes on when a brake operation or the like is performed.

The taillight 1501 may include the organic light-emitting element according to the present embodiment. The taillight may have a protective member for protecting an organic EL element. The protective member may be formed of any transparent material with moderately high strength and can be formed of polycarbonate or the like. The polycarbonate may be mixed with a furan dicarboxylic acid derivative, an acrylonitrile derivative, or the like.

The automobile 1500 may have a body 1503 and a window 1502 on the body 1503. The window may be a transparent display as long as it is not a window for checking the front and rear of the automobile. The transparent display may include the organic light-emitting element according to the present embodiment. In such a case, constituent materials, such as electrodes, of the organic light-emitting element are transparent materials.

The moving body according to the present embodiment may be a ship, an aircraft, a drone, or the like. The moving body may include a body and a lamp provided on the body. The lamp may emit light to indicate the position of the body. The lamp includes the organic light-emitting element according to the present embodiment.

Application examples of the display apparatus according to one of the embodiments are described below with reference to FIGS. 10A and 10B. The display apparatus can be applied to a system that can be worn as a wearable device, such as smart glasses, a head-mounted display (HMD), or smart contact lenses. An imaging and displaying apparatus used in such an application example includes an imaging apparatus that can photoelectrically convert visible light and a display apparatus that can emit visible light.

Figure 10A:
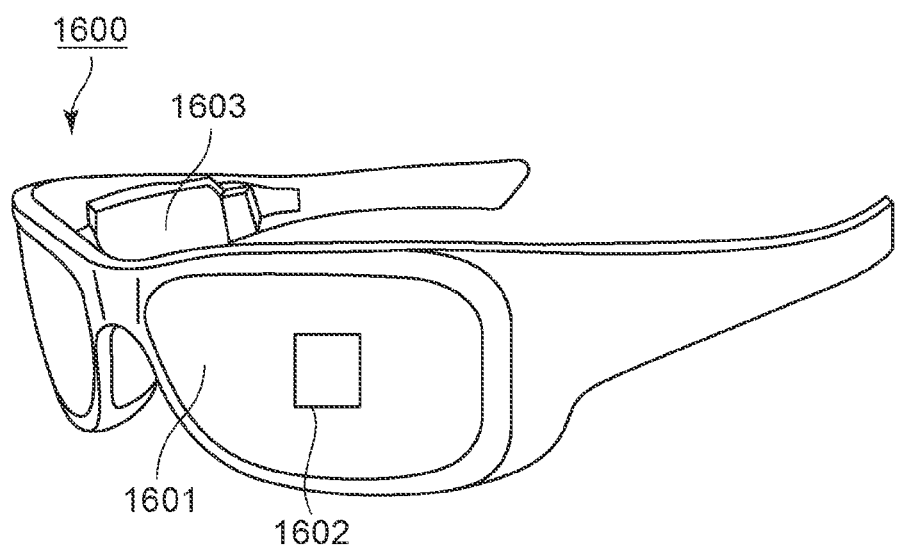
FIG. 10A is a schematic view of an example of a wearable device according to an embodiment of the present disclosure.

FIG. 10A illustrates glasses 1600 (smart glasses) according to one application example. An imaging apparatus 1602, such as a complementary metal-oxide semiconductor (CMOS) sensor or a single-photon avalanche photodiode (SPAD), is provided on the front side of a lens 1601 of the glasses 1600. The display apparatus according to one of the embodiments is provided on the back side of the lens 1601.

The glasses 1600 further include a controller 1603. The controller 1603 functions as a power supply for supplying power to the imaging apparatus 1602 and the display apparatus according to one of the embodiments. The controller 1603 controls the operation of the imaging apparatus 1602 and the display apparatus. The lens 1601 has an optical system for focusing light on the imaging apparatus 1602.

Figure 10B:
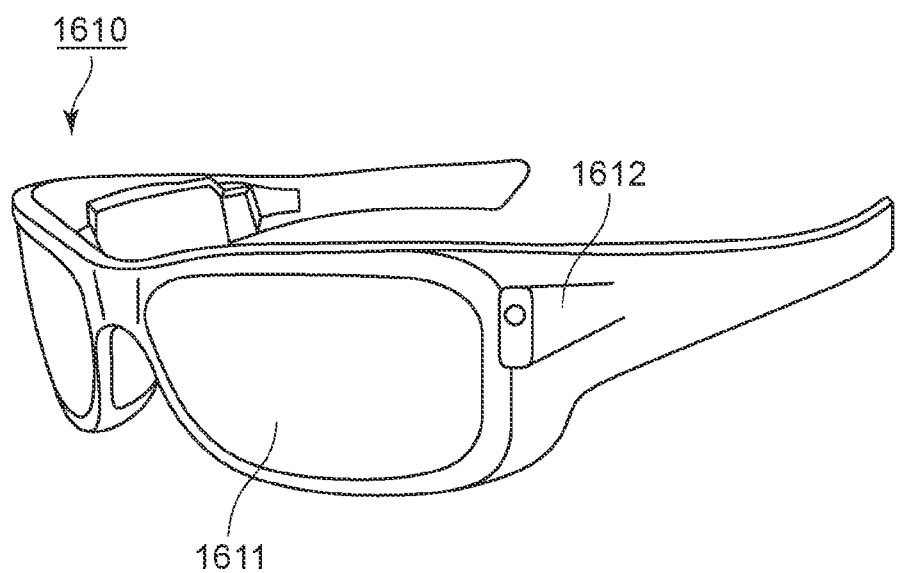
FIG. 10B is a schematic view of an example of a wearable device according to an embodiment of the present disclosure with an imaging apparatus.

FIG. 10B illustrates glasses 1610 (smart glasses) according to one application example. The glasses 1610 have a controller 1612, which includes an imaging apparatus corresponding to the imaging apparatus 1602 and a display apparatus. A lens 1611 includes an optical system for projecting light from the imaging apparatus of the controller 1612 and the display apparatus, and an image is projected on the lens 1611. The controller 1612 functions as a power supply for supplying power to the imaging apparatus and the display apparatus and controls the operation of the imaging apparatus and the display apparatus. The controller may include a line-of-sight detection unit for detecting the line of sight of the wearer. Infrared radiation may be used to detect the line of sight. An infrared radiation unit emits infrared light to an eyeball of a user who is gazing at a display image. Reflected infrared light from the eyeball is detected by an imaging unit including a light-receiving element to capture an image of the eyeball. A reduction unit for reducing light from the infrared radiation unit to a display unit in a plan view is provided to reduce degradation in image quality.

The line of sight of the user for the display image is detected from the image of the eyeball captured by infrared imaging. Any known technique can be applied to line-of-sight detection using the image of the eyeball. For example, it is possible to use a line-of-sight detection method based on a Purkinje image obtained by the reflection of irradiation light by the cornea.

More specifically, a line-of-sight detection process based on a pupil-corneal reflection method is performed. The line of sight of the user is detected by calculating a line-of-sight vector representing the direction (rotation angle) of an eyeball on the basis of an image of a pupil and a Purkinje image included in a captured image of the eyeball using the pupil-corneal reflection method.

A display apparatus according to an embodiment of the present disclosure may include an imaging apparatus including a light-receiving element and may control a display image on the basis of line-of-sight information of a user from the imaging apparatus.

More specifically, on the basis of the line-of-sight information, the display apparatus determines a first visibility region at which the user gazes and a second visibility region other than the first visibility region. The first visibility region and the second visibility region may be determined by the controller of the display apparatus or may be received from an external controller. In the display region of the display apparatus, the first visibility region may be controlled to have higher display resolution than the second visibility region. In other words, the second visibility region may have lower resolution than the first visibility region.

The display region has a first display region and a second display region different from the first display region, and the priority of the first display region and the second display region depends on the line-of-sight information. The first visibility region and the second visibility region may be determined by the controller of the display apparatus or may be received from an external controller. A region with a higher priority may be controlled to have higher resolution than another region. In other words, a region with a lower priority may have lower resolution.

The first visibility region or a region with a higher priority may be determined by artificial intelligence (AI). The AI may be a model configured to estimate the angle of the line of sight and the distance to a target ahead of the line of sight from an image of an eyeball using the image of the eyeball and the direction in which the eyeball actually viewed in the image as teaching data. The AI program may be stored in the display apparatus, the imaging apparatus, or an external device. The AI program stored in an external device is transmitted to the display apparatus via communication.

For display control based on visual recognition detection, the present disclosure can be applied to smart glasses further having an imaging apparatus for imaging the outside. Smart glasses can display captured external information in real time.

As described above, an apparatus including the organic light-emitting element according to the present embodiment can be used to stably display a high-quality image for extended periods.

EXAMPLES

Exemplary Embodiment 1

The present disclosure is described below with exemplary embodiments. The present disclosure is not limited to these exemplary embodiments.

First, a metal layer was formed on a substrate and was etched in a desired region using a mask pattern or the like to form a lower electrode. An insulating layer was then formed to cover the edge of the lower electrode. In the present exemplary embodiment, the insulating layer was formed of silicon oxide and had a thickness of 90 nm on the upper surface of the lower electrode in the direction perpendicular to the upper surface of the substrate. The insulating layer thus formed was etched in a desired region using a mask pattern or the like to form an opening. In the present exemplary embodiment, the pixel array had a delta arrangement, the distance between adjacent opening portions was 1.4 μm, and the distance between adjacent lower electrodes was 0.6 μm. As illustrated in FIG. 2, the pixels were arranged in the delta arrangement in which each pixel had a hexagonal shape.

An organic layer was then formed. The organic layer included a hole-injection layer, a hole-transport layer, an electron-blocking layer, a two-layer light-emitting layer, an electron-transport layer, and an electron-injection layer in this order. First, a 7-nm film of the following compound 1 was formed as the hole-injection layer on the substrate.

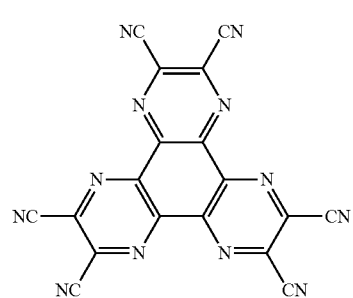

Compound 1

A 5-nm film of the following compound was then formed as the hole-transport layer, and a 10-nm film of the following compound 3 was formed as the electron-blocking layer. The light-emitting layer had a two-layer structure. First, a light-emitting layer containing the following compound 4 as a host material and the following compound 5 as a light-emitting dopant was formed as a first light-emitting layer. The weight ratio of the light-emitting dopant was adjusted to 3%, and the thickness of the first light-emitting layer was 10 nm.

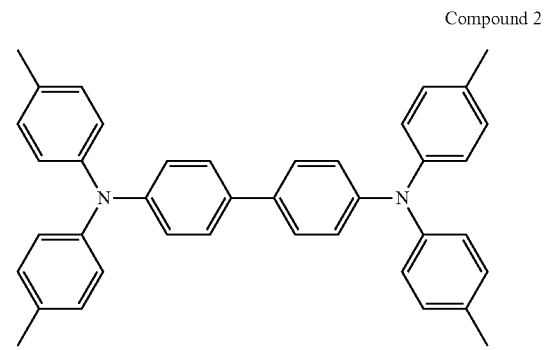

Compound 2

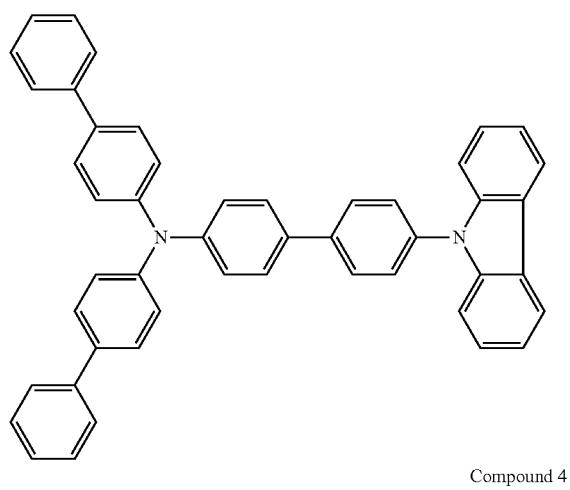

Compound 3

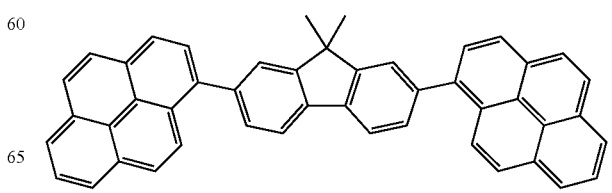

Compound 4

-continued

Compound 5

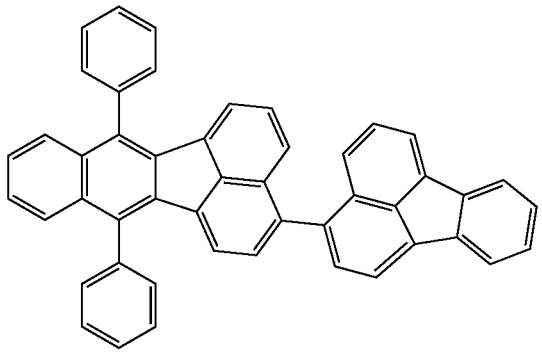

A light-emitting layer containing the compound 4 as a host material and the following compound 6 as a light-emitting dopant was then formed as a second light-emitting layer. The weight ratio of the light-emitting dopant was adjusted to 1%, and the thickness of the second light-emitting layer was 10 nm. After the light-emitting layer with the two-layer structure was formed, a 34-nm film of the following compound 7 was formed as an electron-transport layer, and a 0.5-nm film of LiF was formed as an electron-injection layer.

Compound 6

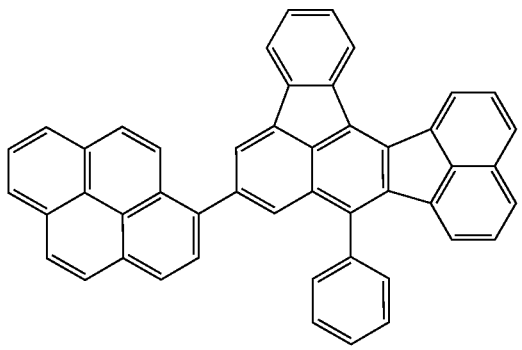

Compound 7

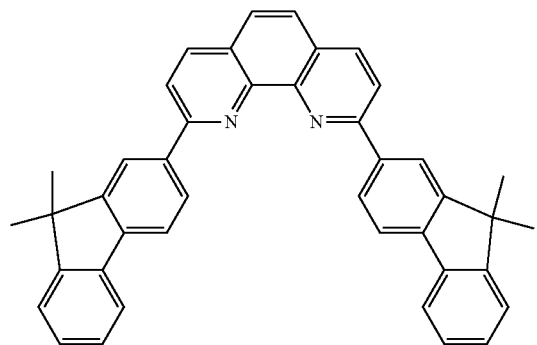

After the organic layer was formed, a 10-nm film of a MgAg alloy with a ratio of Mg to Ag of 1:1 was formed as an upper electrode. After the upper electrode was formed, a 1.5-μm film of SiN was formed as a protective layer by a CVD method. After the protective layer was formed, a planarization layer, a color filter, and a planarization layer were formed. Furthermore, microlenses were formed on organic light-emitting elements. Finally, a resin layer whose transmittance was increased by photoirradiation was formed as a transmittance-increasing layer on the microlenses.

An electric current with a current density of 400 mA/cm$^2$ was applied to a blue light-emitting pixel of an organic light-emitting apparatus of Exemplary Embodiment 1, and the luminance was measured during continuous operation. The time for the luminance to decrease by 5%, 10%, and 15% of the initial luminance in the continuous operation was measured.

Comparative Example 1

An organic light-emitting apparatus was produced in the same manner as in Exemplary Embodiment 1 except that no transmittance-increasing layer was formed on the microlenses.

Table 1 shows the time for the luminance to decrease by 5%, 10%, and 15% in Exemplary Embodiment 1 and Comparative Example 1. Due to the effects of the transmittance-increasing layer, the decrease in luminance from the initial luminance is smaller in Exemplary Embodiment 1 than in Comparative Example 1 for extended periods.

TABLE 1

|  | Exemplary Embodiment 1 | Comparative Example 1 |
| --- | --- | --- |
| 5% decrease time | 150 h | 10 h |
| 10% decrease time | 200 h | 20 h |
| 15% decrease time | 250 h | 30 h |

As described above, the present disclosure can provide a light-emitting element with a smaller decrease in the luminance of extracted light due to the increase in transmittance by a transmittance-increasing layer even when the light emission of a light-emitting layer is reduced.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-034573 filed Mar. 7, 2022, which is hereby incorporated by reference herein in its entirety.

What is claimed is:

1. A light-emitting element comprising:
   a first electrode;
   a second electrode; and
   a light-emitting layer between the first electrode and the second electrode,
   wherein the light-emitting element includes a transmittance-increasing layer with increasing transmittance in an optical path of light emitted from the light-emitting layer, and
   wherein the transmittance-increasing layer contains a first material and a second material, the first material is a compound with increasing transmittance, and the second material is a compound with higher transmittance than the first material.

2. The light-emitting element according to claim 1, wherein the optical path is an optical path of light extracted from the light-emitting element.

3. The light-emitting element according to claim 1, further comprising:
an optical member on a light extraction side of the light-emitting element,
wherein the optical member includes a first surface with a protrusion and a second surface opposite the first surface, and
the transmittance-increasing layer is in contact with the first surface.

4. The light-emitting element according to claim 1, further comprising:
an optical member on a light extraction side of the light-emitting element,
wherein the optical member includes a first surface with a protrusion and a second surface opposite the first surface, and
the transmittance-increasing layer is in contact with the second surface.

5. The light-emitting element according to claim 1, wherein a difference between a peak wavelength of an optical absorption spectrum of the first material and a peak wavelength of an emission spectrum of light emitted from the light-emitting layer is 50 nm or less.

6. The light-emitting element according to claim 5, wherein the peak wavelength of the optical absorption spectrum of the first material is 400 nm or more and 760 nm or less.

7. The light-emitting element according to claim 1, wherein the first material is a compound containing naphthoquinone diazide.

8. The light-emitting element according to claim 1, wherein the second material is an organic resin.

9. The light-emitting element according to claim 1, wherein the transmittance-increasing layer has a blue region with a higher optical absorption than another region.

10. The light-emitting element according to claim 1, wherein the transmittance-increasing layer has a rate of increase in transmittance of 10% or less.

11. The light-emitting element according to claim 1, wherein a difference between a rate of increase in transmittance of the transmittance-increasing layer and a rate of decrease in luminance of the light-emitting layer is 2% or less.

12. The light-emitting element according to claim 1, wherein the transmittance-increasing layer is in contact with a hollow layer.

13. The light-emitting element according to claim 1, wherein the transmittance-increasing layer has an increased transmittance by receiving light emitted from the light-emitting layer.

14. The light-emitting element according to claim 1, further comprising:
a reflective layer configured to reflect light emitted from the light-emitting layer, and
an optical interference layer between the reflective layer and the first electrode.

15. The light-emitting element according to claim 1, wherein the light-emitting layer is an organic layer.

16. A display apparatus comprising a plurality of pixels, wherein at least one of the plurality of pixels includes the light-emitting element according to claim 1 and a transistor coupled to the light-emitting element.

17. An imaging apparatus comprising:
an optical unit with a plurality of lenses;
an imaging element configured to receive light passing through the optical unit; and
a display unit configured to display an image taken by the imaging element,
wherein the display unit includes the light-emitting element according to claim 1.

18. Electronic equipment comprising:
an optical unit including the light-emitting element according to claim 1;
a housing in which the display unit is provided; and
a communication unit provided in the housing and configured to communicate with an outside.

19. A lighting apparatus comprising:
a light source including the light-emitting element according to claim 1; and
a light-diffusing unit or an optical filter configured to transmit light emitted from the light source.

20. An image-forming apparatus comprising:
a light source including the light-emitting element according to claim 1; and
a photosensitive member configured to receive light from the light source, wherein the light from the light source forms an electrostatic latent image on the photosensitive member.

21. A light-emitting element comprising:
a first electrode;
a second electrode; and
a light-emitting layer between the first electrode and the second electrode,
wherein the light-emitting element includes a transmittance-increasing layer with increasing transmittance in an optical path of light emitted from the light-emitting layer, and
wherein a difference between a rate of increase in transmittance of the transmittance-increasing layer and a rate of decrease in luminance of the light-emitting layer is 2% or less.

* * * * *